United States Patent [19]

Petitpierre et al.

[11] Patent Number: 5,463,532

[45] Date of Patent: Oct. 31, 1995

[54] ELECTRICAL CIRCUIT CARD WITH EMI SHIELDING STRIP ADAPTED TO MAKE CONTACT WITH NON-OUTWARDLY FACING SURFACE OF CARD-RECEIVING HOUSING

[75] Inventors: Eric M. Petitpierre, Westminster, Md.; John E. Holmes, Woodbridge, Va.

[73] Assignee: Hubbell Incorporated, Orange, Conn.

[21] Appl. No.: 227,887

[22] Filed: Apr. 15, 1994

[51] Int. Cl.$^6$ ............................... H05K 7/14; H05K 9/00
[52] U.S. Cl. ................. 361/800; 174/35 R; 174/35 GC; 361/212; 361/220; 361/736; 361/753; 361/799; 361/816; 361/818
[58] Field of Search ........................... 174/35 R, 35 GC, 174/35 TS, 51; 211/41; 206/275; 220/402; 307/91, 100; 361/212, 220, 221–222, 730, 736, 752, 753, 796, 797, 799, 800, 816, 818; 439/61, 62, 92, 93, 95, 101, 102, 103, 609, 607

[56] References Cited

U.S. PATENT DOCUMENTS

| | | | |
|---|---|---|---|
| 3,276,560 | 10/1966 | Wirtz | 197/18 |
| 3,469,015 | 9/1969 | Warren | 174/35 R |
| 3,573,558 | 4/1971 | Babcock | 317/101 |
| 3,860,318 | 1/1975 | Reavis, Jr. et al. | 439/99 |
| 3,904,810 | 9/1975 | Kraus | 174/35 R |
| 3,917,978 | 11/1975 | Menzel et al. | 361/220 |
| 4,070,557 | 1/1978 | Ostapovitch | 200/51.1 |
| 4,203,148 | 5/1980 | McComas | 361/752 |
| 4,301,494 | 11/1981 | Jordan | 361/796 |
| 4,384,165 | 5/1983 | Loving, Jr. et al. | 174/35 R |

(List continued on next page.)

FOREIGN PATENT DOCUMENTS

| | | |
|---|---|---|
| 0090539 | 10/1983 | European Pat. Off. . |
| 2571922 | 10/1984 | France . |
| 2844576 | 4/1980 | Germany . |
| 3211758 | 10/1983 | Germany . |
| 3228393 | 2/1984 | Germany . |
| 3231886 | 3/1984 | Germany ............................... 361/800 |
| 3626852 | 2/1988 | Germany ............................... 361/785 |
| 1-95568 | 4/1989 | Japan . |

(List continued on next page.)

OTHER PUBLICATIONS

M. Hodgetts, "A Shielded Computer Interface Connector", *Fifteenth Annual Connectors and Interconnection Technology Symposium Proceedings*, pp. 113–118 (Nov. 1982).

J. Landis, "Approaches to EMI Control in Digital Data Transmission Systems", *Fifteenth Annual Connectors and Interconnection Technology Symposium Proceedings*, pp. 355–364 (Nov. 1982).

(List continued on next page.)

*Primary Examiner*—Donald A. Sparks
*Attorney, Agent, or Firm*—Jerry M. Presson; John E. Holmes

[57] ABSTRACT

An electrical circuit card adapted to be inserted into a grounded, electrically conductive housing comprises an insulative circuit board, an insulative faceplate coupled to the circuit board along the front edge thereof, and an electrically conductive shielding strip or shunt located behind the faceplate for reducing EMI emissions from the circuit card. The shielding strip comprises an intermediate portion extending generally vertically along the rear surface of the faceplate, and upper and lower contacts adapted to be brought into electrical contact with the housing when the circuit card is inserted into the housing. At least one of the upper and lower contacts is arranged to be brought into contact with a non-outwardly facing surface of the housing, such as the edge of a designator strip located above or below the opening in which the circuit card is received. The use of a non-outwardly facing housing surface for making contact with the shielding strip simplifies the manufacture of the designator strip by eliminating the masking step necessary to provide a bare metal contact area, improves the appearance of the finished designator strip while allowing more space for printed indicia, and affords a contact surface which is less likely to accumulate dirt and other contaminants.

20 Claims, 7 Drawing Sheets

U.S. PATENT DOCUMENTS

| | | | |
|---|---|---|---|
| 4,386,388 | 5/1983 | Beun | 361/752 |
| 4,525,802 | 6/1985 | Hackamack | 364/900 |
| 4,567,317 | 1/1986 | Ehrlich et al. | 174/35 R |
| 4,631,641 | 12/1986 | Brombal et al. | 361/818 |
| 4,683,550 | 7/1987 | Jindrick et al. | 364/900 |
| 4,694,380 | 9/1987 | Mallory et al. | 361/818 |
| 4,713,633 | 12/1987 | Saito et al. | 333/222 |
| 4,744,006 | 5/1988 | Duffield | 361/785 |
| 4,758,928 | 7/1988 | Wierce et al. | 361/796 |
| 4,762,966 | 8/1988 | Kosanda | 174/35 R |
| 4,780,570 | 10/1988 | Chuck | 174/35 R |
| 4,791,524 | 12/1988 | Teigen et al. | 361/212 |
| 4,821,145 | 4/1989 | Corfits et al. | 361/818 |
| 4,829,432 | 5/1989 | Hershberger et al. | 361/818 |
| 4,851,609 | 7/1989 | Reddy | 174/35 R |
| 4,864,458 | 9/1989 | Demorat, Jr. et al. | 361/212 |
| 4,872,212 | 10/1989 | Roos et al. | 361/818 |
| 4,894,753 | 1/1990 | Wadell et al. | 361/800 |
| 4,903,170 | 2/1990 | Finney et al. | 361/818 |
| 4,970,625 | 11/1990 | Belanger et al. | 361/818 |
| 4,991,062 | 2/1991 | Nguyenngoc | 361/818 |
| 5,084,802 | 1/1992 | Nguyenngoc | 361/818 |
| 5,335,147 | 8/1994 | Weber | 361/818 |

FOREIGN PATENT DOCUMENTS

| | | | |
|---|---|---|---|
| 2-100398 | 4/1990 | Japan . | |
| 3-116997 | 5/1991 | Japan | 361/799 |
| 3-224298 | 10/1991 | Japan | 361/799 |
| 4-15996 | 1/1992 | Japan | 361/800 |
| 4-94191 | 3/1992 | Japan . | |
| 5-55781 | 3/1993 | Japan . | |
| 5-55767 | 3/1993 | Japan | 361/800 |
| 2196798 | 5/1988 | United Kingdom . | |
| 2208970 | 4/1989 | United Kingdom . | |
| 2263199 | 7/1993 | United Kingdom | 361/800 |

OTHER PUBLICATIONS

D. Eaby, "Developing a Metal Shell Circular Plastic Connector", *Fifteenth Annual Connectors and Interconnection Technology Symposium Proceedings*, pp. 365–374 (Nov. 1982).

*Guide to Interference Control Using Beryllium Cooper*, Instrument Specialities Co., Inc., Catalog $E^3$–78 (1987).

"EMI/ESD Depletion Strip", *IBM Technical Disclosure Bulletin* vol. 32, No. 3B, pp. 126–127 (Aug. 1989).

Sears and Zemansky, *University Physics*, Fourth Edition, pp. 392–393.

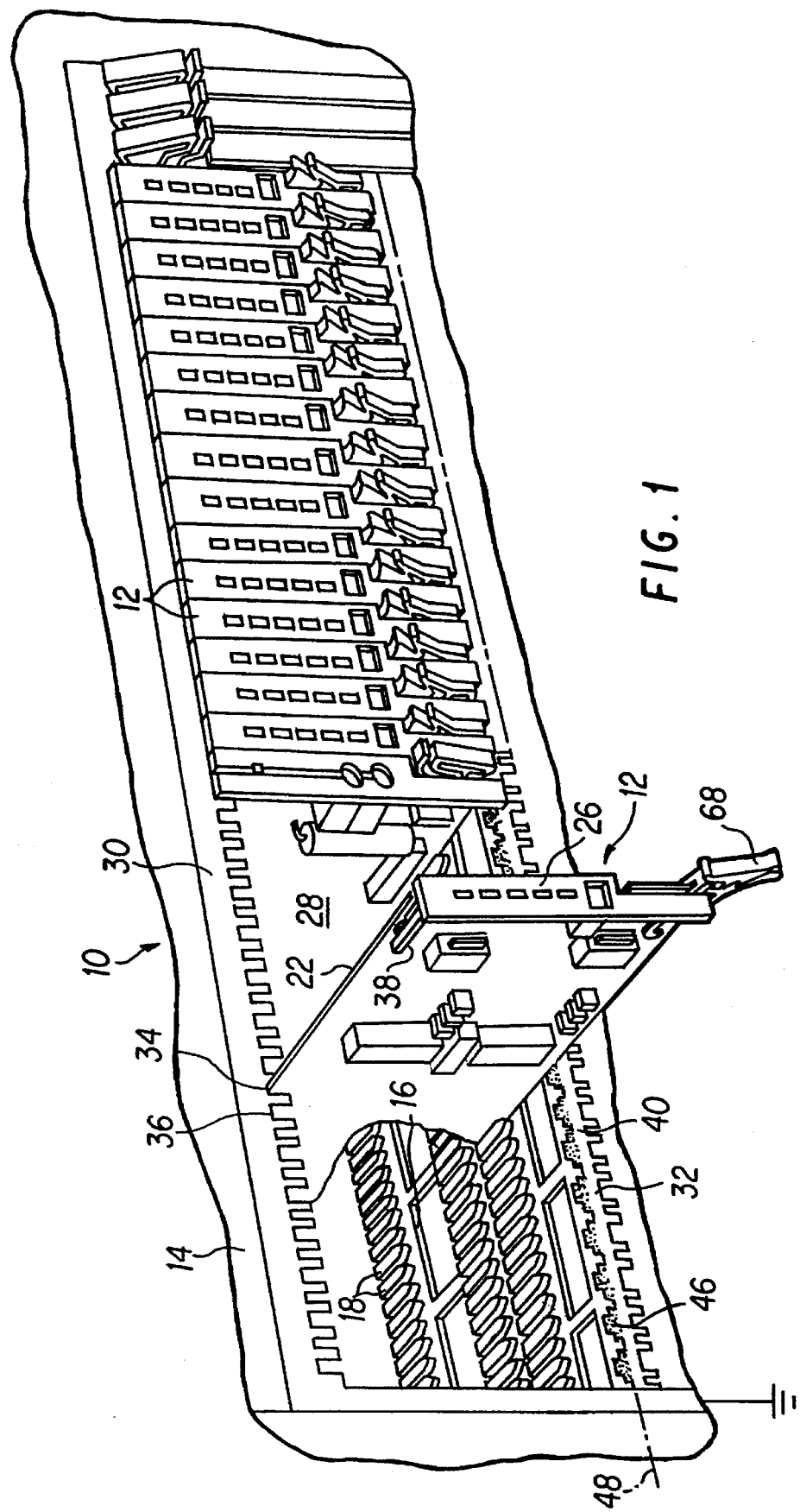

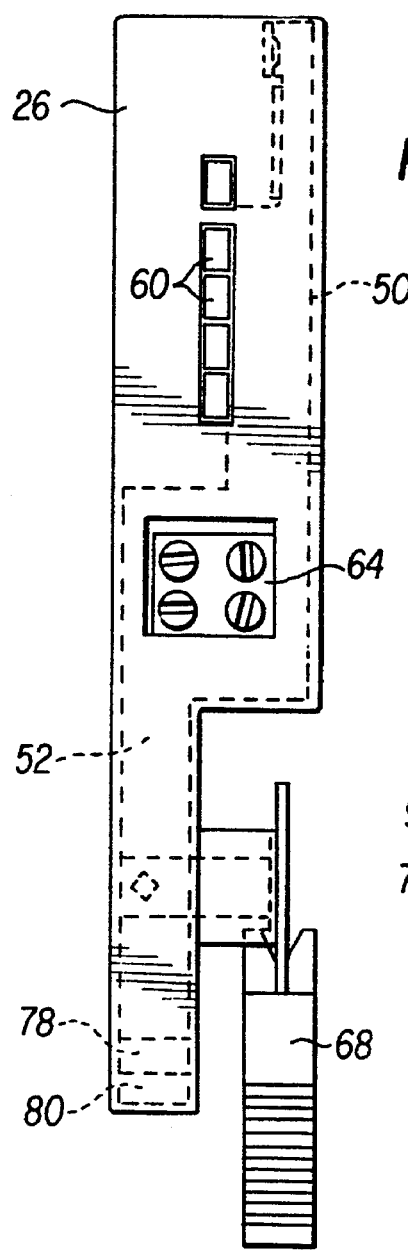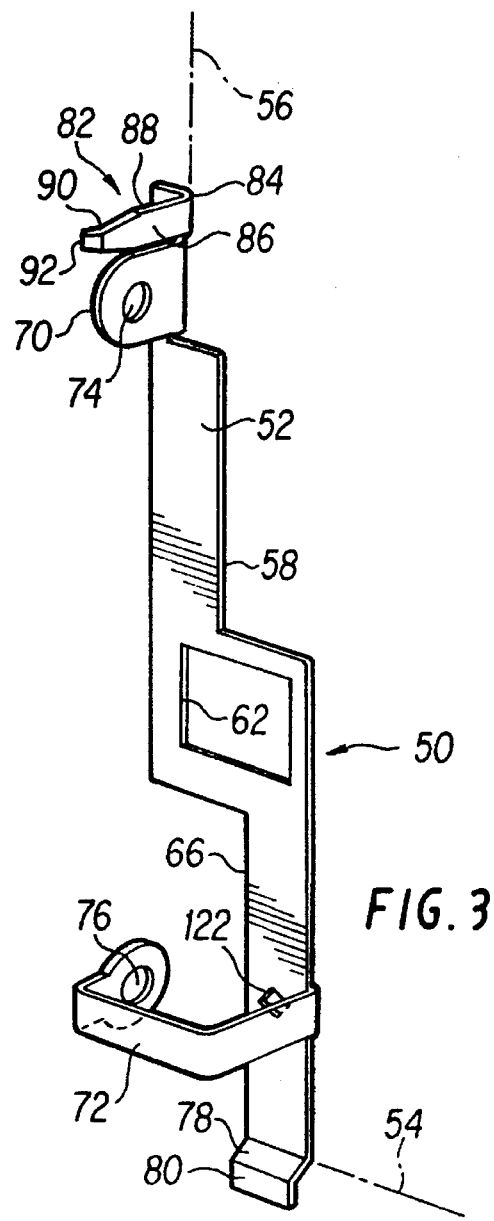

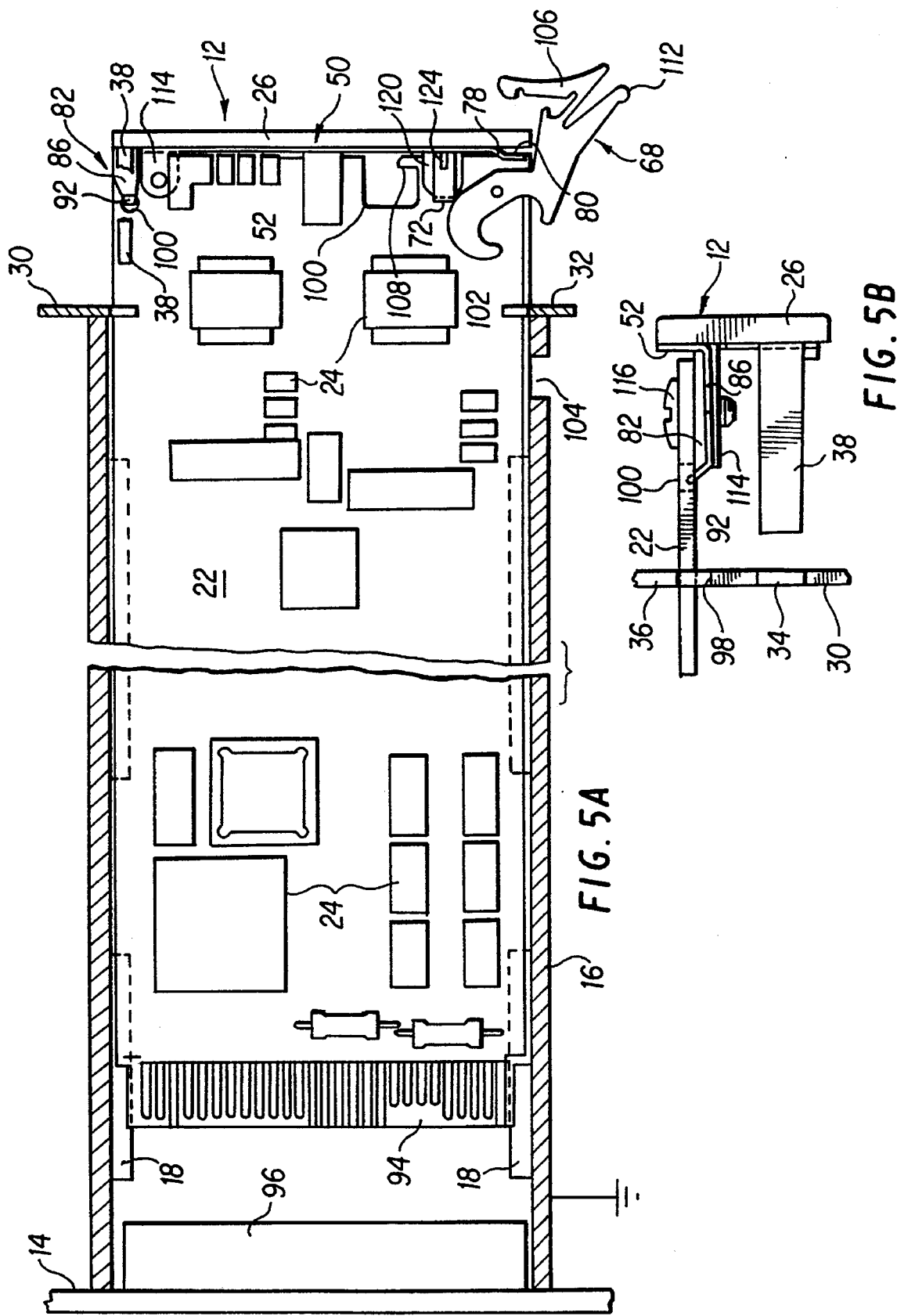

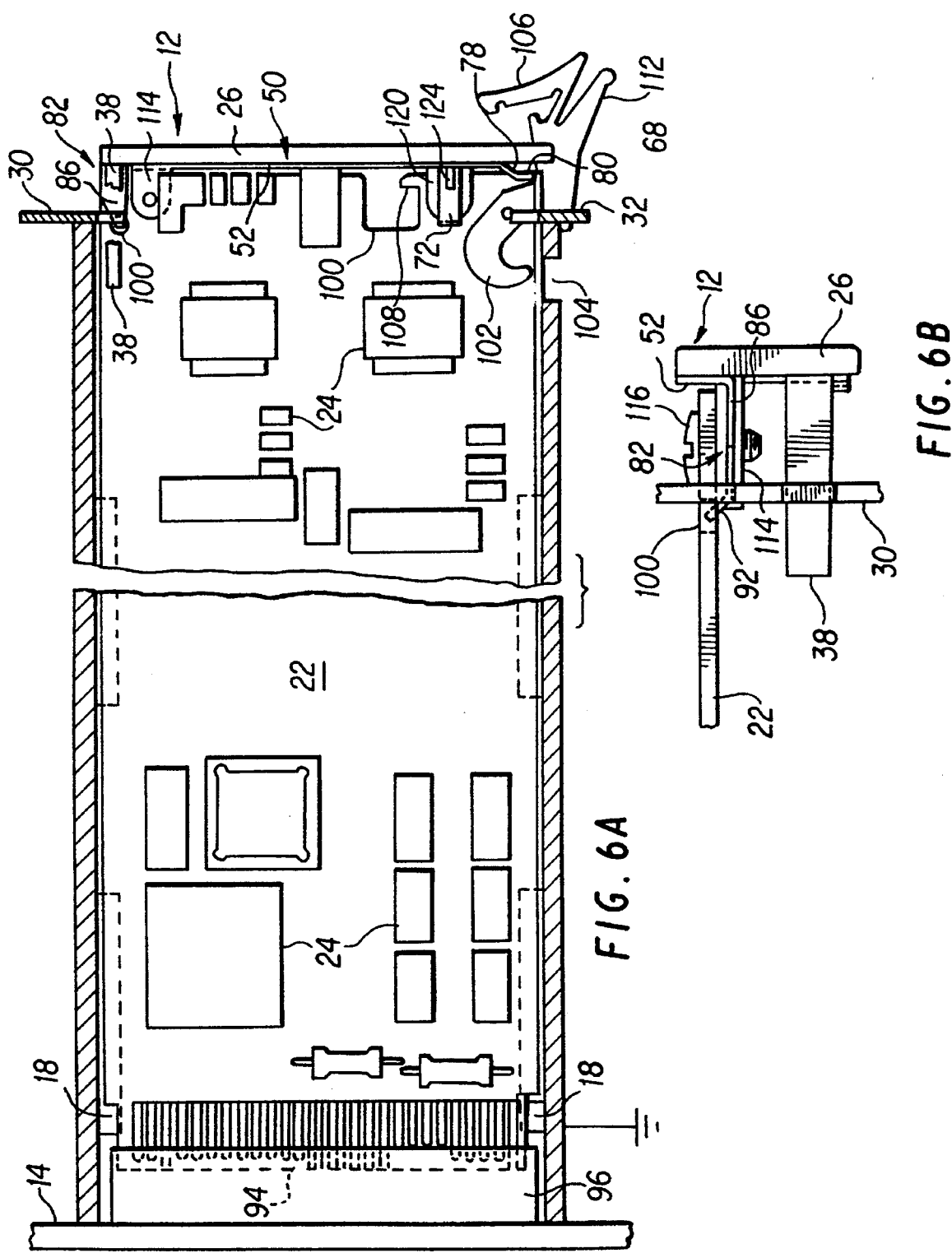

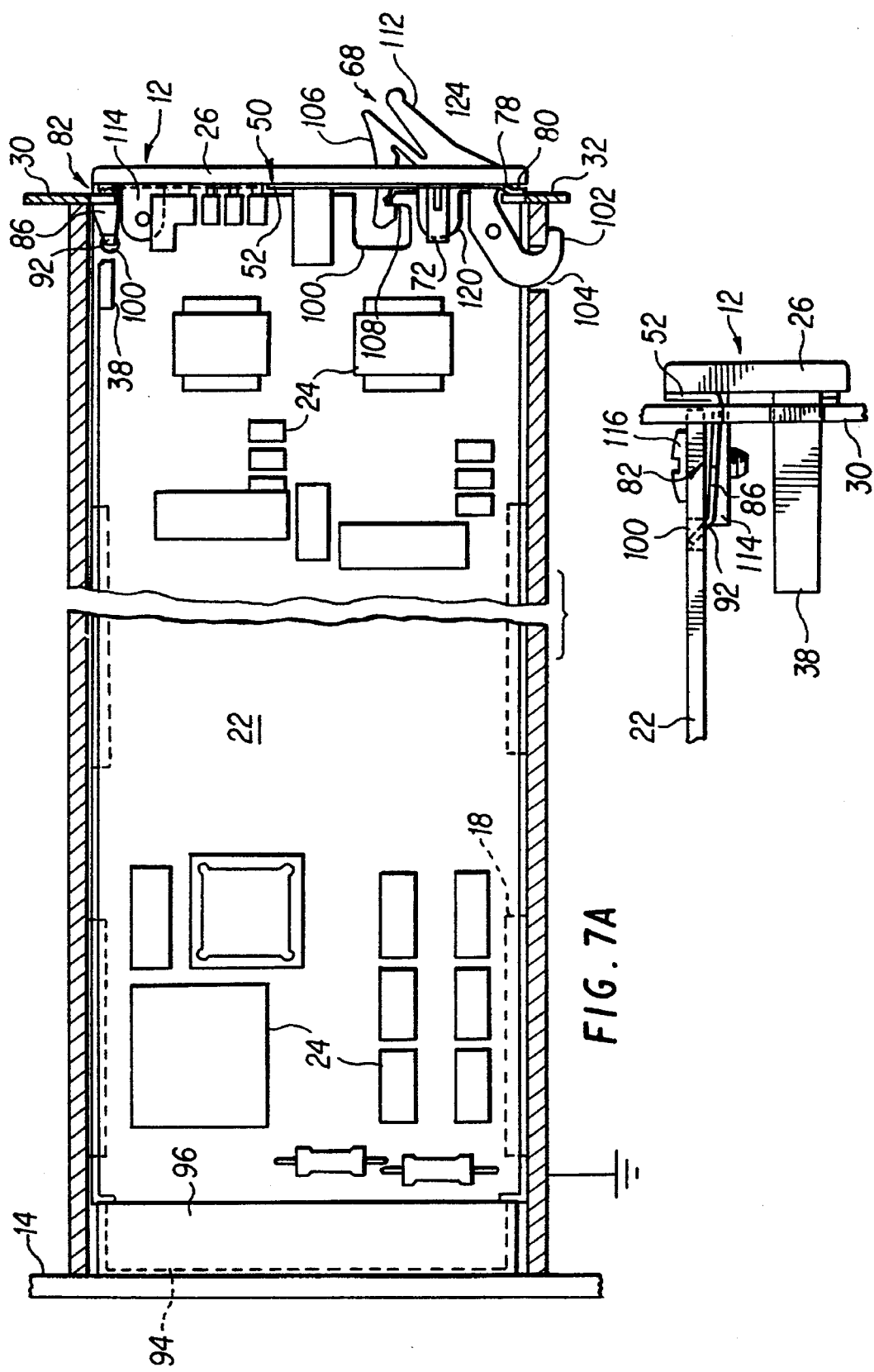

ELECTRICAL CIRCUIT CARD WITH EMI SHIELDING STRIP ADAPTED TO MAKE CONTACT WITH NON-OUTWARDLY FACING SURFACE OF CARD-RECEIVING HOUSING

CROSS-REFERENCE TO RELATED APPLICATIONS

Related subject matter is disclosed and claimed in copending U.S. patent application Ser. No. 08/189,900, filed by Eric M. Petitpierre on Jan. 31, 1994 and entitled "ELECTRICAL CIRCUIT CARD WITH REDUCED EMI. EMISSION", and in U.S. patent application Ser. No. 08/262,375, filed by Wilfred L. Gleadall on Jun. 20, 1994 and entitled "CIRCUIT CARD ASSEMBLY WITH SHIELDING ASSEMBLY FOR REDUCING EMI EMISSIONS" now U.S. Pat. No. 5,386,346, which is a continuation of prior application Ser. No. 07/068,801 filed on Nov. 12, 1992 and now abandoned, which is a continuation of prior application Ser. No. 07/751,192, filed on Aug. 29, 1991 and now abandoned, the disclosures of all such applications and patents being expressly incorporated herein by reference.

1. Field of the Invention

The present invention relates to electrical circuit card assemblies in which the emission of electromagnetic interference (EMI) into the surrounding environment is reduced. More specifically, the invention relates to an electrical circuit card assembly in which an electrically conductive shielding strip located behind the faceplate of the card assembly makes contact with the conductive frame or housing into which the card assembly is inserted, in order to reduce EMI emissions that would otherwise occur through the housing.

2. Background of the Invention

Many types of analog and digital electrical equipment produce stray electromagnetic radiation, referred to as electromagnetic interference (EMI), which is emitted into the surrounding environment. The EMI usually results from analog circuit components which oscillate at high frequencies, or from digital components which operate at high clocking or switching rates. These emissions are undesirable since they can, if sufficiently strong, interfere with the operation of radio receivers and other nearby electrical equipment. Regulations have been established for the maximum permissible EMI emissions from various types of electrical equipment, and these regulations must be taken into account when designing new equipment in which EMI might be a problem.

For some types of electronic equipment, such as telephone channel banks used to carry out analog-to-digital and digital-to-analog conversion between subscriber lines and telephone company lines, EMI reduction is difficult because of the basic design of the equipment and the practical need to allow access to the equipment by service personnel. Typically, telephone channel banks consist of rows of pull-out circuit cards, referred to as channel units, which are contained in a metal frame or housing. The housing is grounded and provides effective EMI shielding at the top, bottom, sides and back of the channel banks, but there is little shielding at the front since the frame must be left open to allow for the removal and replacement of the individual channel units. In essence, the rectangular front opening of each row or shelf in the housing serves as a slot or waveguide antenna for the electromagnetic radiation. Even though these openings are physically closed off by the channel unit faceplates when all of the channel units are fully inserted, they are electrically open since the channel unit faceplates are typically made of plastic and are essentially transparent to electromagnetic radiation.

Several approaches have been developed for reducing EMI emissions in telephone channel banks. In one approach, exemplified by U.S. Pat. Nos. 4,991,062 and 5,084,802, both to Nguyenngoc, a resilient metal strip is fastened to the back of the channel unit faceplate and is bent outwardly near its upper and lower ends to form spring contacts which extend rearwardly at an angle from the plane of the faceplate. When the channel unit is inserted into the grounded channel bank housing, the spring contacts are brought into contact with outwardly facing conductive areas of the housing located immediately above and below the channel bank shelf opening, thereby creating an electroconductive shunt across the shelf opening and reducing its effectiveness as a slot antenna. Although this arrangement is effective in theory, there is a practical disadvantage in that the spring contacts must essentially be flattened against the back surface of the faceplate during insertion of the channel unit in order to insure full contact with the conductive surfaces of the housing. If this does not occur, either because of poor manufacturing tolerances or because the channel unit has not been fully inserted, the spring contacts will touch the housing over a much smaller area. This can increase the impedance of the shunt (particularly if dirt or other contaminants are present) and reduce its ability to suppress EMI emissions. The degree of bending required to flatten the spring contacts can also deform the spring contacts over time, reducing their resiliency.

In the aforementioned U.S. patent of Wilfred L. Gleadall, which is assigned to the assignee of the present invention, a different approach is taken. Rather than providing spring contacts at the top and bottom of the conductive strip for connecting both ends of the strip to the frame or housing, a spring contact is provided only at the top of the conductive strip. However, the conductive strip is also connected to ground by means of a printed ground wire on the channel unit circuit board itself, thereby allowing a separate ground connection to be made through the edge connector at the rear of the channel unit card. In this way, the conductive strip is reliably connected to ground without depending entirely on the quality of the electrical contact between the spring contact and the conductive surface of the housing. However, EMI suppression is affected to some extent by the lack of a direct shunt across the channel bank opening itself, and the need for a printed ground wire on the channel unit circuit board may be undesirable in some instances.

A third approach to the reduction of EMI emissions in telephone channel banks is disclosed in the aforementioned copending U.S. patent application of Eric M. Petitpierre, also assigned to the assignee of the present invention. In this design, the conductive shielding strip comprises resilient upper and lower spring arms which extend rearwardly at an angle from the intermediate portion of the shielding strip, and upper and lower contact pads at the ends of the respective upper and lower spring arms. In contrast to the spring contacts of Nguyenngoc U.S. Pat. Nos. 4,991,062 and 5,084,802, the upper and lower contact pads form planar contact areas which are disposed at an angle relative to the respective upper and lower spring arms, and are oriented vertically so that they are parallel to the corresponding electrical contact areas of the housing in which the card assembly is inserted. The planar contact areas of the contact pads allow low impedance connections to be formed between the ends of the conductive shielding strip and the conductive contact areas of the housing, without requiring that the spring arms themselves be flattened against the contact areas of the housing. As a result, reliable and effective connections can be made without requiring precise manufacturing tolerances for the circuit card assembly or housing, and without requiring that the circuit card assembly be fully inserted into the housing.

In some situations, it may be desirable to avoid the need to establish electrical contact between the EMI shielding strip and the outwardly facing conductive areas of the housing in which the channel unit is inserted. Generally, these outwardly facing conductive areas are provided on metal designator strips which are affixed to the housing above and below the channel bank shelf opening. The primary purpose of these designator strips is to carry printed legends or indicia which indicate the correct placement of the channel units in the channel bank shelf. When the designator strip is also required to provide conductive contact areas for the EMI shielding strips, these areas must be masked off during fabrication of the designator strip so that they remain free of paint or printed indicia. The masking step complicates the manufacture of the designator strip, and the resulting bare metal areas leave less area available for printed indicia. These bare metal areas also detract from the appearance of the finished designator strip and, because they face outwardly from the housing, are potentially exposed to various types of dirt and contaminants which can affect the quality of the electrical connections between the designator strip and the channel unit shielding strips. For all of these reasons, it would be advantageous to establish electrical contact between the EMI shielding strip of a channel unit and the housing in which the channel unit is received, without relying on outwardly facing contact areas provided by designator strips or the like.

SUMMARY OF THE INVENTION

The primary object of the present invention is to provide an electrical circuit card assembly in which EMI reduction is realized through the use of a conductive strip or shunt, while at the same time avoiding the disadvantages and limitations of the prior art.

A further object of the invention is to provide an electrical circuit card assembly in which at least one of the upper and lower ends of a conductive strip or shunt used for EMI suppression is adapted to make contact with a non-outwardly facing surface of the designator strip or other adjacent portion of the frame or housing in which the circuit card assembly is received, thereby improving the appearance of the designator strip, allowing more space on the designator strip for printed indicia, and reducing problems caused by the accumulation of dirt and contaminants on the designator strip.

A further object of the invention is to provide an electrical circuit card assembly in which at least one end of a conductive strip or shunt used for EMI suppression is arranged to make grounding contact with the card-receiving frame or housing before the card is fully inserted, in order to assist in draining off static charges from the card assembly before it becomes electrically connected to other circuitry in the frame or housing.

A still further object of the invention is to provide an electrical circuit card assembly in which a conductive strip of relatively simple and inexpensive construction is used for EMI reduction, and in which precise manufacturing tolerances are not required to assure proper contact between the conductive strip and the frame or housing in which the circuit card assembly is received.

The foregoing objects are substantially achieved by providing an electrical circuit card assembly with an improved electrically conductive strip or shunt for reducing the emission of electromagnetic interference when the circuit card assembly is received in an electrically conductive housing. The housing is of the type comprising a horizontally extending front opening, outwardly facing surfaces located above and below the front opening, and non-outwardly facing surfaces located within or adjacent to the opening. The circuit card assembly comprises an insulative circuit board having a front edge, a rear edge, longitudinally extending side edges, and a generally planar surface having electrical circuitry thereon. An insulative faceplate is coupled to the circuit board along the front edge thereof, and has a rear surface facing the circuit board. An electrically conductive shunt is carried by at least one of the circuit board and the faceplate for reducing the emission of electromagnetic interference from the circuit card assembly. The electrically conductive shunt comprises an intermediate portion extending generally vertically along the rear surface of the faceplate, and upper and lower contacts adapted to be brought into contact with the housing when the circuit board is inserted into the housing. At least one of the upper and lower contacts in adapted to be brought into contact with a non-outwardly facing surface of the housing when the circuit card assembly is inserted into the housing. In a preferred embodiment, the non-outwardly facing surface of the housing comprises a side surface of a designator strip attached to the housing, and the corresponding contact comprises a resilient contact strip which extends rearwardly in the longitudinal direction of the circuit board for making contact with the side surface of the designator strip. This avoids the need to provide bare metal areas on the outwardly-facing surfaces of the designator strip, thereby improving its appearance and providing more space for printed indicia. Moreover, if the resilient contact strip extends rearwardly from the circuit card faceplate by a sufficient distance, electrical contact can occur between the conductive shunt and the designator strip before the circuit card has been fully inserted into the housing. This is advantageous in draining off static charges from the circuit card as it is being installed.

The present invention is directed to an electrically conductive shunt of the type described above, to an electrical circuit card incorporating such a shunt, and to an electrical assembly comprising a housing and an electrical circuit card incorporating a shunt of the type described. The present invention is also directed to a method for reducing the emission of electromagnetic interference from an electrical circuit card through the use of a conductive shunt of the type contemplated herein.

BRIEF DESCRIPTION OF THE DRAWINGS

Referring now to the drawings, which form a part of the original disclosure:

FIG. 1 is a perspective view of a telephone channel bank, with one channel unit shown partially inserted;

FIG. 2 is a front view of the channel unit faceplate, illustrating in dashed lines the profile of a conductive shunt or shielding strip provided behind the faceplate for reducing EMI emissions;

FIG. 3 is a rear perspective view of the conductive shielding strip;

FIGS. 5A and 5B are partial side and top sectional views, respectively, showing one channel unit partially inserted into the channel bank housing;

FIGS. 6A and 6B are partial side and top sectional views, respectively, showing the channel unit inserted further into the channel bank housing than in FIGS. 5A and 5B, but not yet fully inserted;

FIGS. 7A and 7B are partial side and top sectional views, respectively, showing the channel unit fully inserted into the channel bank housing.

DETAILED DESCRIPTION OF THE PREFERRED EMBODIMENTS

Figure 4A:
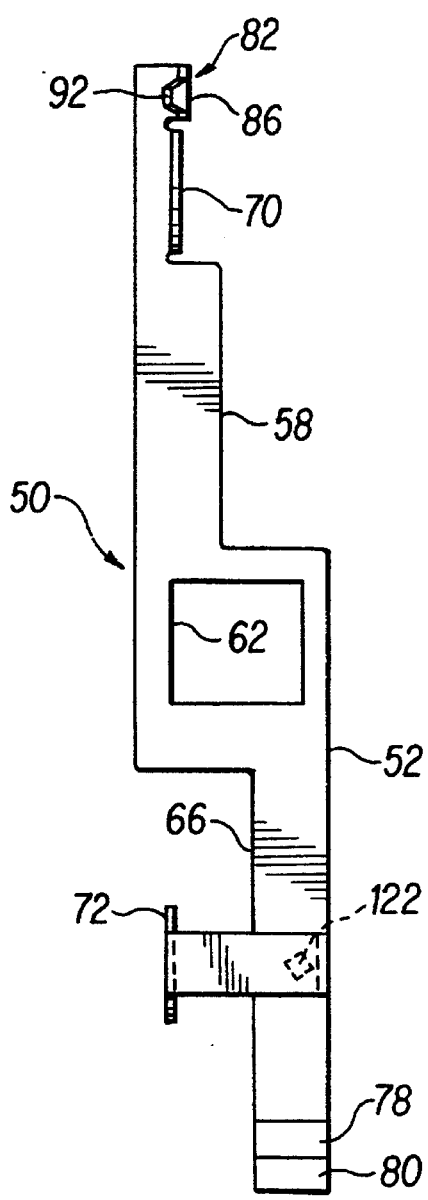
FIG. 4A, 4B and 4C are rear, side, and top views of the conductive shielding strip.
Figure 4B:
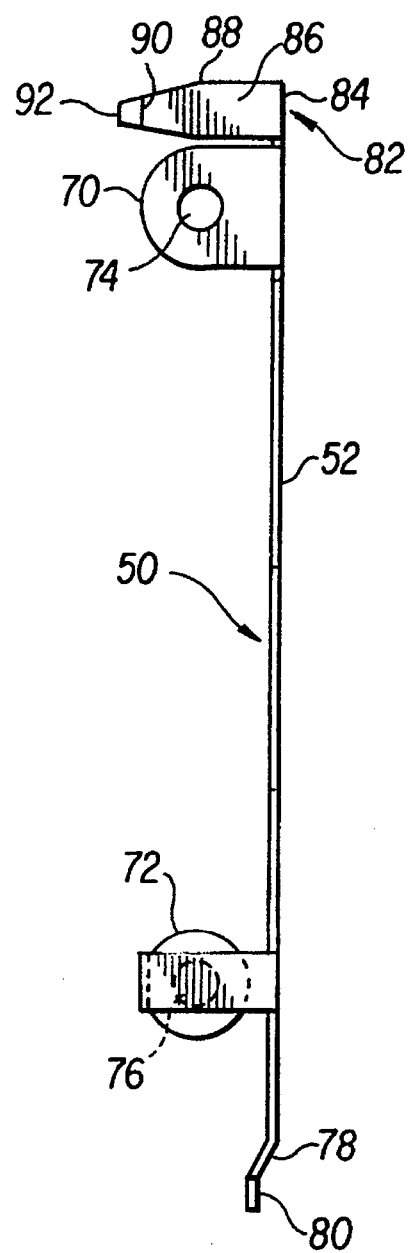
Figure 4C:
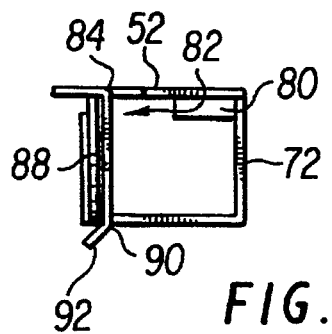

FIG. 1 illustrates a telephone channel bank 10 in which the present invention may be advantageously employed. The channel bank 10 comprises a horizontal row of pull-out circuit cards 12, referred to as channel units, which are held vertically in a side-by-side arrangement as shown. The channel units 12 are received in a grounded metal frame or housing 14, which is typically made of aluminum. Only the top portion of the housing 14 is shown in FIG. 1, it being understood that the housing 14 will ordinarily include additional rows of channel units 12 below the row shown. Internally, the housing 14 includes perforated metal shelves 16 located above and below each row of channel units 12, and the shelves 16 are formed with raised guides 18 which form slots or grooves 20 for receiving the channel units 12. Each channel unit 12 comprises a rectangular insulative circuit board 22 having various electronic components 24 on its left-hand vertical surface, and an insulative faceplate 26 connected to the circuit board 22 along the front edge thereof. When the channel unit 12 is fully inserted into the channel bank 10, the faceplate 26 lies vertically across the horizontal rectangular opening 28 in the housing 14.

Metal designator strips 30 and 32 are affixed by screws (not shown) to the forward surface of the housing 14 immediately above and below the opening 28. The purpose of the designator strips 30 and 32 is to carry legends or indicia (not shown) which indicate the proper placement of the channel units 12 in the channel bank 10. Certain types of circuit cards other than channel units, such as optical-electrical interface (OEI) cards and transmit-receive units (TRUs), are typically included in the channel bank 10, and the designator strips 30 and 32 also indicate the proper placement of these additional circuit cards. For each circuit card location, the upper designator strip 30 is formed with two adjacent notches 34 and 36. The smaller notch 34 serves as a guide to allow the circuit board 22 of the channel unit 12 to be inserted into the opening 28 in alignment with the corresponding grooves 20 defined between the upper set of internal guides 18. The larger notch 36 is a keyway notch which receives a corresponding key 38 formed on the upper part of the channel unit faceplate 26. The key 38 aligns with the notch 36 only when the circuit card is of the proper type for the card location in question, thereby preventing the wrong type of circuit card from being inserted at that location. The lower designator strip 32 is formed with notches 40 which all have the same stepped configuration. The narrow bottom portions of the notches 40 serve to guide the lower edge of the circuit board 22 into the grooves 20 between the frame guides 18, and the wider upper portions of the notches 40 provide clearance for the electrical components 24 located near the lower edge of the circuit board 22.

As will be described in more detail hereinafter, the lower designator strip 32 is used to establish an electrical connection between a conductive shielding strip or shunt located behind the faceplate 26 of each channel unit 12 and the grounded, conductive frame or housing 14 of the channel bank 10. To this end, the upper portions 46 (indicated by stippling) of the designator strip 32 above the line 48 are left bare or unpainted to provide electrical contact surfaces. The remaining outwardly facing areas of the lower designator strip 32 (and the entire outwardly facing surface of the upper designator strip 30) are painted and contain printed legends (not shown) indicating the proper placement of the channel units 12 and other circuit cards as described previously. The designator strips 30 and 32 are affixed to the conductive frame or housing 14 by means of metal screws, thereby establishing electrical continuity between the unpainted electrical contact areas 46 of the lower designator strip 32 and the metal frame 14. It will be noted that the lower designator strip 32 includes a lower set of notches similar to the notches 34 and 36 in the upper designator strip 30. This lower set of notches corresponds to the opening for the next lower row of channel units in the channel bank 10, which is not shown in FIG. 1.

EMI emission from the channel units 12 of FIG. 1 is reduced by providing each channel unit 12 with an electrically conductive shielding strip or shunt 50 which extends generally vertically along the rear surface of the faceplate 26. The area occupied by the shielding strip 50 behind the faceplate 26 is illustrated in FIG. 2, and the configuration of the shielding strip 50 itself is illustrated in detail in FIGS. 3 and 4A–4C. The shielding strip 50 comprises an intermediate portion 52 which is generally planar, and which is adapted to lie substantially flat along the planar rear surface of the faceplate 26. The intermediate portion 52 extends from the line 54 in FIG. 3 to the top of the shielding strip 50, leftward of the line 56. This portion includes a number of notches and cut-outs which provide clearance for various components of the channel unit 12. For example, the notched area 58 provides clearance for light-emitting diodes (LEDs) 60 shown in FIG. 2, and the square aperture 62 accommodates a test jack 64 in FIG. 2. Similarly, the notched area 66 provides clearance for the rotation of a latch 68 in FIG. 2. Attachment of the shielding strip 50 to the channel unit 12 is facilitated by means of two integrally formed tabs 70 and 72 which are bent outwardly from the plane of the intermediate portion 52. The upper tab 70 is bent at 90° from the plane of the intermediate portion 52, and is provided with a hole 74. The lower tab 72 consists of three sections bent at 90° with respect to each other to form a "U", with the last section containing a hole 76. The manner in which the tabs 70 and 72 are used to secure the shielding strip 50 to the channel unit 12 will be described shortly in connection with FIG. 8.

With continued reference to FIGS. 3 and 4A–4C, the intermediate portion 52 of the conductive shielding strip 50 carries at its lower end a spring arm 78 and a contact pad 80. The spring arm 78 extends rearwardly from the intermediate portion 52 of the shielding strip 50 at an angle relative to the plane of the intermediate portion 52. The contact pad 80 forms a planar electrical contact area which is, in the illustrated embodiment, oriented vertically and parallel both to the rear surface of the faceplate 26 and to the plane of the intermediate portion 52 of the shielding strip 50. The lower contact pad 80 is adapted to be brought into contact with one of the planar, vertically oriented unpainted areas 46 of the lower designator strip 32 in FIG. 1 when the channel unit 12 is inserted into the frame or housing 14. The construction of the spring arm 78 and contact pad 80 are preferably as set forth in the aforementioned copending U.S. patent application of Eric M. Petitpierre, to which reference may be had for a discussion of the advantages of this construction.

In accordance with an important feature of the present invention, the intermediate portion 52 of the shielding strip 50 carries at its upper end a contact structure which, unlike the spring arm 78 and contact pad 80 at the lower end of the shielding strip, does not require that contact be made with an outwardly facing surface of the corresponding designator strip 30 of FIG. 1. In particular, the upper contact structure comprises a resilient contact arm 82 which extends from the upper right-hand edge of the intermediate portion 52 of the shielding strip 50, and which is bent along an arc 84 so that the main portion 86 of the contact arm 82 extends rearwardly at an angle of slightly more than 90° with respect to the plane of the adjoining intermediate portion 52. The main portion 86 of the contact arm 82 has a constant width for approximately one-half of its length, and at an intermediate point 88 begins to taper in the rearward direction toward a fold line 90 at which the width of the contact arm 82 has been reduced by approximately one-half. As will be evident from FIG. 4B, the taper is slightly asymmetrical as between the top and bottom edges of the contact arm 82, with a slightly greater angle of taper along the top edge than along the bottom edge. At the fold line 90, the contact arm 82 is bent outwardly (i.e., toward the left-hand edge of the intermediate portion 52 of the shielding strip 50 in FIGS. 3, 4A and 4C) at an angle of preferably 30° to 45° relative to the main portion 86 of the contact arm, to form a short end portion 92 which terminates in a free end. The end portion 92 of the contact arm 82 may be tapered in the same manner as the main portion 86, as shown, or may be left untapered.

FIGS. 5A, 5B, 6A, 6B, 7A and 7B are sectional views illustrating the manner in which the shielding strip 50 is brought into contact with the frame or housing 14 when the channel unit 12 is inserted into the housing. In FIGS. 5A and 5B, the channel unit 12 is shown partially inserted. The upper and lower edges of the circuit board 22 are received in the grooves formed between the rows of upper and lower guides 18, but the edge strip or plug 94 at the rear edge of the circuit board 22 is not yet received in the edge connector 96 at the rear of the frame or housing 14. The shielding strip 50 is shown in its installed position on the channel unit 12 in FIGS. 5A and 5B, with the intermediate portion 52 of the shielding strip 50 extending vertically along the rear surface of the channel unit faceplate 26. When the channel unit 12 is in the partially inserted position shown in FIGS. 5A and 5B, neither the lower contact pad 80 nor the upper contact arm 82 is in contact with the housing 14, and no deflection of either contact structure has taken place. As can be seen most clearly in FIG. 5B, the position of the upper contact arm 82 is such that its main portion 86 is approximately parallel to, and spaced slightly away from, the surface of the circuit board 22 which faces the key 38. The contact arm 82 is also positioned so that the surface of the main portion 86 facing the key 38 will be brought into contact with the unpainted vertical side surface 98 of the slot 34 in the upper designator strip 30 when the channel unit 12 is moved further in the left-hand direction in FIG. 5B. In order to facilitate such contact, the angle from the main portion 86 of the contact arm 82 to the rear surface of the channel unit faceplate 26 is preferably made slightly more than 90° (measured clockwise in FIG. 5B). This allows for lateral deflection of the contact arm 82 in the upward direction in FIG. 5B as the channel unit 12 is inserted. The bent end portion 92 of the contact arm 82 extends in a direction toward the plane of the circuit board 22, and is partially received in a circular through-hole 100 formed near the top edge of the circuit board. By recessing the end portion 92 of the contact arm 82 in this manner, the possibility that the free end of the contact arm 82 will collide with the edge of the slot 34 in the upper designator strip 30 during insertion of the channel unit 12 is eliminated. The bent end portion 92 of the contact arm 82 allows gradual, progressive contact to occur between the contact arm 82 and the vertical side surface 98 of the designator strip notch 34 as the channel unit 12 is inserted into the housing 14. It will be observed from FIGS. 5A and 5B that the tapering of the rear portion of the contact arm 82 reduces the width of the contact arm 82 so that its end portion 92 is small enough to be received in the hole 100. This tapering will not be necessary if, for example, the hole 100 is provided in the form of an elongated slot which opens to the top edge of the circuit board 22, or if the contact arm 82 has a constant width that is less than the diameter of the circular hole 100. However, the illustrated embodiment is preferable since the circular hole 100 serves the additional purpose of aligning the channel unit 12 on a test fixture during manufacturing operations, and since the width of the contact arm 82 should preferably be maximized where possible (particularly in the area of the arc 84, where the most bending occurs) to increase its strength and resistance to fatigue with repeated bending.

In FIGS. 6A and 6B, the channel unit has been moved further to the left but is not yet fully inserted into the housing 14. In this position, the contact arm 86 has made initial contact with the vertical side surface 98 of the notch 34 in the upper designator strip 30. As a result of this initial contact, the contact arm 82 has begun to deflect in the upward direction in FIG. 6B, and as a result the end portion 92 of the contact arm 82 has moved further into the hole 100. The vertical side surface 98 of the notch 34, as with all surfaces of the designator strip 30 other than the forward or outwardly-facing surface that is visible in FIG. 1, is free of paint and provides a bare metal contact surface to which an efficient electrical connection can be made. Thus, when the channel unit 12 is inserted by the distance shown in FIGS. 6A and 6B, there is electrical continuity between the top of the shielding strip 50 and the frame or housing 14 by virtue of the abutting contact between the contact arm 82 and the vertical side surface 98 of the notch 34 in the upper designator strip 30. This contact occurs prior to contact between the lower contact pad 80 of the shielding strip 50 and the lower designator strip 32, thereby allowing the shielding strip 50 to assist in draining off static charges from the channel unit 12 before the channel unit 12 is fully inserted in the housing 14. It is also significant to note that, in the position of the channel unit 12 shown in FIGS. 7A and 7B, there is electrical contact between the contact arm 82 and the frame or housing 14 before the edge plug 94 has been fully engaged with the edge connector 96. (Although the edge plug 94 is shown inserted into the edge connector 96 by a small distance in FIG. 6A, electrical connections are not established until the edge plug 94 is inserted at least halfway into the edge connector 96.) Thus, static discharge can occur through the shielding strip 50 before any electrical connections are established between the channel unit 12 and the channel bank circuitry coupled to the edge connector 96.

In FIGS. 7A and 7B, the channel unit 12 has been moved still farther to the left, and is now fully inserted into the frame or housing 14. In this position, the region of contact between the contact arm 82 and the vertical side surface 98 of the designator strip notch 34 has moved closer to the arcuate bend 84 of the contact arm 82, resulting in greater deflection of the contact arm 82 and further extension of its end portion 92 into the hole 100. In addition, the contact pad 80 at the bottom of the shielding strip 50 is now in contact with the bare metal area 46 of the lower designator strip 32 in FIG. 1. As a result, both ends of the shielding strip are now in electrical contact with the frame or housing 14, and the shielding strip 50 is fully effective to reduce EMI emissions from the housing 14 when the channel unit 12 is in operation. A pivotable plastic latch 68 is used to retain the channel unit 12 in the fully inserted position within the housing 14. When the latch 68 is rotated to its fully counter-clockwise position, as shown in FIG. 7A, a locking hook 102 extends through an opening 104 in the lower shelf 16 of the frame or housing 14 to hold the channel unit 12 in position, and a pawl arm 106 engages a projecting tooth 108 formed in a cut-out portion 110 of the circuit board 22 to hold the latch 68 in position. The latch 68 can be returned to the position shown in FIGS. 5A and 6A by squeezing the pawl arm 106 and handle portion 112 together to disengage the pawl arm 106 from the tooth 108, and then rotating the latch 68 in a clockwise direction to disengage the locking hook 102 from the opening 104. The channel unit 12 can then be removed from the frame or housing 14 by sliding the entire unit 12 in the right-hand direction while gripping the latch 68.

Figure 8:
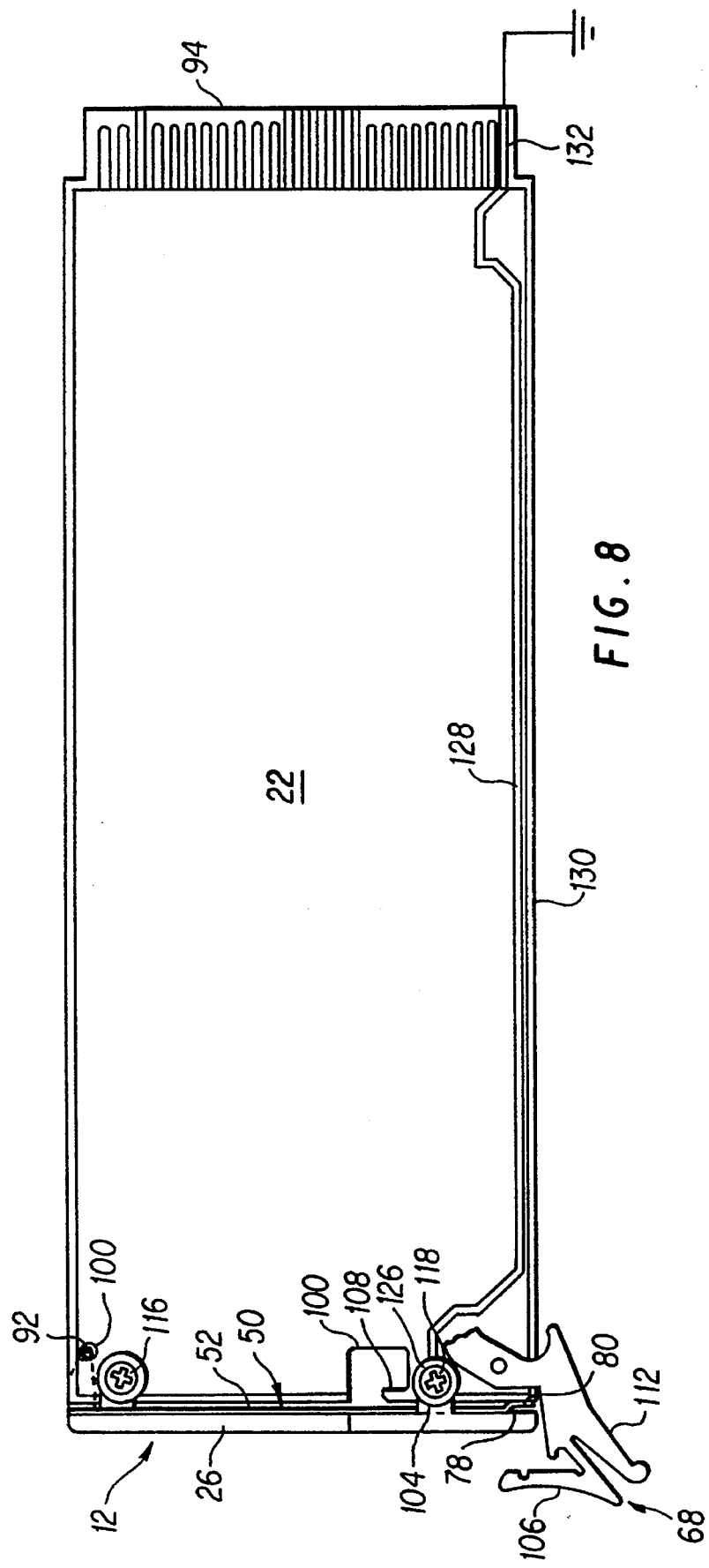
FIG. 8 is a back view of the channel unit, shown removed from the channel bank housing.

The manner in which the shielding strip 50 is affixed to the circuit board 22 and faceplate 26 can be understood by reference to FIG. 8, which illustrates the back or rear side of the channel unit 12, and to FIGS. 5A, 5B, 6A, 6B, 7A and 7B, described above. The faceplate 26 includes a rearwardly projecting boss 114 for receiving a metal screw 116. The screw 116 passes through the circuit board 22, hole 74 of tab 70, and boss 114, thereby locking the tab 70 between the circuit board 22 and the boss 114. In a similar manner, a second metal screw 118 passes through the circuit board 22 and hole 76 of tab 72, and is received in a hole formed in a second boss 120 extending rearwardly from the rear surface of the faceplate 26 at a point below the upper boss 114. Thus, the end of the lower tab 72 of the shielding strip 50 is locked in place between the circuit board 22 and lower boss 120 of the faceplate 26. In order to maintain the shielding strip 50 in position along the rear surface of the faceplate 26 during assembly, the shielding strip 50 is provided with a square hole 122 (visible in FIGS. 3 and 4A) at a location adjacent to the lower tab 72. The square hole 122 is press-fitted around a small cylindrical pin 124 extending rearwardly from the rear surface of the faceplate 26, in order to join the shielding strip 50 to the rear surface of the faceplate 26.

In order to increase the effectiveness of the conductive shielding strip 50 in reducing EMI emissions, and to assist in draining off static charges from the channel unit 12 as it is being installed, the shielding strip 50 may also be connected to a ground terminal through a printed ground wire on the circuit board 22 itself. This is illustrated in FIG. 8. The metal screw 118 establishes a conductive connection between the lower tab 72 of the conductive shielding strip 50 and a metallic ring 126 formed on the circuit board 22. The metallic ring 126 is connected to a printed ground wire 128 which runs along the lower edge 130 of the circuit board 22 and terminates in a printed ground contact pad 132 on the edge plug 94. When the edge plug 94 is inserted into the edge connector 96 of FIGS. 4A, 5A and 6A, a firm ground connection is established between the printed ground wire 128 and the frame 14 of the channel bank 10 via the contact pad 132 and edge connector 96. This assures that the conductive shielding strip 50 will be reliably connected to ground whenever the channel unit 12 is fully inserted, even in instances where the lower contact pad 80 or upper contact arm 82 may be inoperative for some reason. If desired, a printed ground wire can be provided between the upper tab 70 of the conductive shielding strip 50 (via the upper metal screw 116) and the edge plug 94, and this ground wire can be in addition to, or in lieu of, the printed ground wire 128.

In a preferred embodiment of the invention, the conductive shielding strip 50 is made from a single stamped strip of metal is bent or folded into the configuration illustrated in FIGS. 3, 4A, 4B and 4C. Various metals may be used, although 0.005-inch thick stainless steel (301 alloy, ½ hard) is preferred since it resists corrosion, provides good resiliency for the spring arm 78 and contact arm 82, and is a good conductor of electrical current. However, other metals such as phosphor bronze and beryllium copper can also be used. The conductive shielding strip 50 need not be made entirely of metal, but may instead consist of a non-metallic material with an outer metallic layer or coating. All or part of the conductive shielding strip 50 may be integrated with the circuit board 22 and/or with the rear surface of the plastic faceplate 26, if desired, by forming the circuit board and/or the rear surface of the faceplate in the desired shape and then applying a metallic layer or coating.

It should be understood that the shielding strip or shunt 50 need not be a one-piece structure as shown, but may comprise a plurality of separate, electrically connected elements carried by the faceplate 26, circuit board 22, or both. For example, the upper contact arm 82 may be replaced by a separate metal contact that is carried by the circuit board 22 and electrically connected to the intermediate portion 52 of the shielding strip 50. As a further modification, the upper contact 82 may be relocated so that it is brought into contact with the keyway notch 36 of the designator strip 30, rather than with the card notch 34. It will also be apparent that the orientation of the upper contact strip 82 may be changed so that it makes contact with the top surface of one of the notches 34 or 36, rather than with the side surface of the notch. Locations and orientations of the contact strip 82 which bring it into contact with non-outwardly facing surfaces of the housing 14 other than those associated with the designator strip 30 are also within the scope of the present invention. Finally, it will be appreciated that the fold line 90 of the contact strip 82 may be replaced by a more gradual arc or bend, and that the contact strip need not terminate in a free end as shown, but may instead be anchored at both ends.

In order to enhance electrical contact with the contact pad 80 and contact arm 82, respectively, the corresponding bare metal areas 46 and 98 of the designator strips 32 and 30 may be coated with an oxidation-inhibiting material such as Iridite®. This material is available from Wito Corporation of New York, N.Y. From a manufacturing standpoint, it may be convenient to apply a coating of Iridite® to the entire outside surfaces of the designator strips 30 and 32, and then to mask the bare metal areas 46 during the subsequent painting and lettering steps. Masking of the bare metal areas 98 will not ordinarily be necessary, since these areas are not on the surface of the designator strip 30 to which paint is ordinarily applied.

The electrical contact areas of the contact pad 80 and contact arm 82 are preferably smooth and flat in order to provide maximum contact area with the smooth, flat unpainted areas 46 and 98 of the respective designator strips 32 and 30. If desired, however, surface texturing may be provided on the contact areas of the contact pad 80 and contact arm 82, and/or on the unpainted areas 46 and 98 of the respective designator strips 32 and 30.

The advantages of the rearwardly extending, laterally deflectable contact arm 82 in providing an upper electrical contact for the shielding strip 50 will be apparent from the foregoing description. Because the contact arm 82 makes contact with the interior side or edge surface 98 of the designator strip notch 34, rather than with an outwardly facing surface of the upper designator strip 30, it is no longer necessary to carry out a separate masking step to provide bare metal surfaces on the outwardly facing portion of the upper designator strip 30. This simplifies the manufacture of the upper designator strip 30, increases the area available for printed indicia, and improves the appearance of the finished designator strip. Moreover, because the contact arm 82 does not make contact with an outwardly facing surface of the designator strip 30 or housing 14, the possibility of poor electrical contact due to the buildup of dirt and other contaminants is reduced.

A further advantage, as explained previously in connection with FIGS. 6A and 6B, is that the contact arm 82 can be used to establish electrical contact between the shielding strip 50 and the channel bank frame or housing 14 at a somewhat earlier point during insertion of the channel unit 12 than is possible with other contact structures, thereby aiding in draining off static charges from the channel unit 12 as it is being installed. The same advantage applies in reverse when the channel unit is removed from the housing 14. In that situation, the contact arm 82 maintains electrical contact between the shielding strip 50 and housing 14 even after the channel unit 12 is partially withdrawn.

It will be appreciated that the use of a laterally deflectable contact structure, as exemplified by the laterally deflectable contact arm 82, is also advantageous in that it causes the degree of electrical contact between the shielding strip 50 and the frame or housing 14 to be less dependent on the precise distance by which the channel unit 12 is inserted into the housing 14. Thus, precise manufacturing tolerances are not required to ensure proper contact between the shielding strip 50 and the frame or housing 14.

It will be understood that a laterally deflectable contact arm similar or identical to the contact arm 82 may also be provided at the bottom of the shielding strip 50, in lieu of the spring arm 78 and contact pad 80. In the illustrated embodiment, the presence of the rotating locking hook 102 of the latch 68 at the bottom of the circuit board 22 may obstruct the operation of a laterally deflectable contact placed at this location, and hence the spring arm 78 and contact pad 80 have been utilized at the bottom of the shielding strip 50 to make contact with the outwardly facing surface of the lower designator strip 32. In other embodiments, however, the use of a laterally deflectable contact at the bottom of the shielding strip 50 may be preferable.

The shielding strip 50 is primarily for the purpose of reducing EMI emissions from the channel unit 12, as already described. However, it can also assist in increasing the immunity of the channel unit circuitry to outside sources of EMI.

While only one exemplary embodiment has been chosen to illustrate the present invention, it will be understood by those skilled in the art that various changes and modifications therein, in addition to or in lieu of those already mentioned, can be made without departing from the spirit and scope of the invention as defined in the appended claims.

What is claimed is:

1. An electrical assembly characterized by reduced emission of electromagnetic interference, comprising:

a grounded, electrically conductive housing for receiving a plurality of insertable circuit cards, said housing having a horizontally extending front opening for receiving said circuit cards vertically in a side-by-side manner, outwardly facing surfaces above and below said front opening, and non-outwardly facing surfaces; and at least one electrical circuit card received in said housing, said circuit card comprising:

an insulative circuit board having a front edge, a rear edge, longitudinally extending side edges, and a generally planar surface having electrical circuitry thereon;

an insulative faceplate coupled to said circuit board along the front edge thereof and adapted to lie generally vertically across said front opening of said housing when said circuit card is received in said housing; and an electrically conductive shunt carried by at least one of said circuit board and said faceplate, said electrically conductive shunt comprising an intermediate portion extending generally vertically along the rear surface of said faceplate, and upper and lower contacts adapted to be brought into contact with said housing when said circuit card is inserted into said housing, at least one of said upper and lower contacts being adapted to be brought into contact with a non-outwardly facing surface of said housing bordering said front opening when said circuit card is inserted into said housing, and at least one of said upper or lower contact and said non-outwardly facing surface being resiliently deflected by the other when brought into such contact.

2. An electrical assembly as claimed in claim 1, wherein said housing includes a conductive designator strip providing at least one of said outwardly facing surfaces, and wherein said at least one contact is brought into contact with a non-outwardly facing surface of said designator strip bordering said front opening when said circuit card is inserted into said housing.

3. An electrical assembly as claimed in claim 2, wherein said designator strip includes a vertical notch for receiving one of said side edges of said circuit board, and wherein said at least one contact is brought into contact with a non-outwardly facing surface of said designator strip within said notch when said circuit card is inserted into said housing.

4. An electrical assembly as claimed in claim 3, wherein said at least one contact comprises a resilient contact strip which extends rearwardly in the longitudinal direction of said circuit board, said resilient contact strip being deflectable in a direction perpendicular to said longitudinal direction.

5. An electrical assembly as claimed in claim 4, wherein said resilient contact strip extends parallel to the plane of said circuit board and is deflectable in a direction normal to the plane of said circuit board in order to make contact with a vertical side surface of said designator strip within said notch.

6. An electrical assembly as claimed in claim 5, wherein said resilient contact strip terminates in a free end which moves toward and away from said circuit board during deflection of said contact strip, and wherein said circuit board has a hole for receiving said free end during such deflection.

7. An electrical assembly as claimed in claim 4, wherein said housing includes an edge connector, said circuit board includes an edge plug which engages with said edge connector when said circuit card is inserted into said housing, and said resilient contact strip extends rearwardly by a distance sufficient to allow contact between said contact strip and said designator strip to occur before said edge plug engages with said edge connector during insertion of said circuit card into said housing.

8. An electrical circuit card adapted to be received in a grounded, electrically conductive housing having a horizontally extending front opening, outwardly facing surfaces above and below said front opening, and non-outwardly facing surfaces, said circuit card comprising:

an insulative circuit board having a front edge, a rear edge, longitudinally extending side edges, and a generally planar surface having electrical circuitry thereon;

an insulative faceplate coupled to said circuit board along the front edge thereof, said faceplate having a rear surface facing said circuit board; and an electrically conductive shunt carried by at least one of said circuit board and said faceplate for reducing the emission of electromagnetic interference from said circuit card, said electrically conductive shunt comprising an intermediate portion extending generally vertically along the rear surface of said faceplate, and upper and lower contacts adapted to be brought into contact with said housing when said circuit card is inserted into said housing, at least one of said upper and lower contacts being resiliently deflectable in a direction to the plane of said intermediate portion and adapted to be brought into contact with and resiliently deflected by a non-outwardly facing surface of said housing bordering said front opening when said circuit card is inserted into said housing.

9. An electrical circuit card as claimed in claim 8, wherein said at least one contact comprises a resilient contact strip which extends rearwardly in the longitudinal direction of said circuit board, said resilient contact strip being deflectable in a direction perpendicular to said longitudinal direction.

10. An electrical circuit card as claimed in claim 9, wherein said resilient contact strip extends parallel to the plane of said circuit board and is deflectable in a direction normal to the plane of said circuit board.

11. An electrical circuit card as claimed in claim 10, wherein said resilient contact strip terminates in a free end which moves toward and away from said circuit board during deflection of said contact strip, and wherein said circuit board has a hole for receiving said free end during such deflection.

12. An electrically conductive shunt for reducing the emission of electromagnetic interference from a circuit card adapted to be inserted into a grounded, electrically conductive housing, said circuit card being of the type comprising an insulative circuit board and an insulative faceplate coupled to said circuit board along one edge thereof such that a rear surface of said faceplate faces said circuit board, said shunt comprising:

a substantially planar intermediate portion adapted to extend generally vertically along the rear surface of said faceplate; and resilient upper and lower contacts connected to said intermediate portion for establishing electrical contact with said housing when said circuit card is inserted therein, at least one of said contacts being deflectable in a direction parallel to the plane of said intermediate portion.

13. An electrically conductive shunt as claimed in claim 12, wherein said at least one contact comprises a contact strip which extends in a direction transverse to said intermediate portion.

14. An electrically conductive shunt as claimed in claim 12, wherein said at least one contact terminates in a free end.

15. An electrically conductive shunt as claimed in claim 12, wherein said intermediate portion and said upper and lower contacts are formed integrally from a single strip of metal.

16. A method for reducing the emission of electromagnetic interference from an electrical circuit card which is adapted to be inserted into a grounded, electrically conductive housing having a horizontally extending front opening, outwardly facing surfaces above and below said front opening, and non-outwardly facing surfaces, said circuit card being of the type comprising an insulative circuit board and an insulative faceplate coupled to said circuit board along one edge thereof such that a rear surface of said faceplate faces said circuit board, said method comprising the steps of:

providing said circuit card with an electrically conductive shunt extending generally vertically along the rear surface of said faceplate;

providing said electrically conductive shunt with at least one resiliently deflectable contact for establishing electrical contact with said housing upon insertion of said circuit card into said housing; and inserting said circuit card into said housing to bring said at least one resiliently deflectable contact into electrical contact with a non-outwardly facing surface of said housing bordering said front opening.

17. A method as claimed in claim 16, further comprising the steps of:

providing said electrically conductive shunt with a second contact spaced vertically from said first contact; and upon insertion of said circuit card into said housing to bring said at least one resiliently deflectable contact into electrical contact with said non-outwardly facing surface of said housing, bringing said second contact into electrical contact with a different surface of said housing.

18. A method as claimed in claim 16, wherein the step of inserting said circuit card into said housing to bring said at least one resilient deflectable contact into contact with said non-outwardly facing surface of said housing includes the step of deflecting said contact in a direction parallel to the rear surface of said faceplate.

19. An electrical assembly characterized by reduced emission of electromagnetic interference, comprising:

a grounded, electrically conductive housing for receiving a plurality of insertable circuit cards, said housing having a horizontally extending front opening for receiving said circuit cards vertically in a side-by-side manner, outwardly facing surfaces above and below said front opening, and non-outwardly facing surfaces; and at least one electrical circuit card received in said housing, said circuit card comprising:

an insulative circuit board having a front edge, a rear edge, longitudinally extending side edges, and a generally planar surface having electrical circuitry thereon;

an insulative faceplate coupled to said circuit board along the front edge thereof and adapted to lie generally vertically across said front opening of said housing when said circuit card is received in said housing; and an electrically conductive shunt carried by at least one of said circuit board and said faceplate, said electrically conductive shunt comprising an intermediate portion extending generally vertically along the rear surface of said faceplate, and upper and lower contacts adapted to be brought into contact with said housing when said circuit card is inserted into said housing, at least one of said upper and lower contacts being adapted to be brought into contact with a non-outwardly facing surface of said housing when said circuit card is inserted into said housing; and further wherein:

said housing includes a conductive designator strip providing at least one of said outwardly facing surfaces, said at least one contact being brought into contact with a non-outwardly facing surface of said designator strip bordering said front opening when said circuit card is inserted into said housing;

said designator strip includes a vertical notch for receiving one of said side edges of said circuit board, said outwardly facing surface of said designator strip with which said at least one contact is brought into contact when said circuit card is inserted into said housing being within said notch;

said at least one contact comprises a resilient contact strip which extends rearwardly in the longitudinal direction of said circuit board and parallel to the plane of said circuit board, said resilient contact strip being deflectable in a direction perpendicular to said longitudinal direction and normal to the plane of said circuit board in order to make contact with a vertical side surface of said designator strip within said notch; and said resilient contact strip terminates in a free end which moves toward and away from said circuit board during deflection of said contact strip, and said circuit board has a hole for receiving said free end during such deflection.

20. An electrical circuit card adapted to be received in a grounded, electrically conductive housing having a horizontally extending front opening, outwardly facing surfaces above and below said front opening, and non-outwardly facing surfaces, said circuit card comprising:

an insulative circuit board having a front edge, a rear edge, longitudinally extending side edges, and a generally planar surface having electrical circuitry thereon;

an insulative faceplate coupled to said circuit board along the front edge thereof, said faceplate having a rear surface facing said circuit board; and an electrically conductive shunt carried by at least one of said circuit board and said faceplate for reducing the emission of electromagnetic interference from said circuit card, said electrically conductive shunt comprising an intermediate portion extending generally vertically along the rear surface of said faceplate, and upper and lower contacts adapted to be brought into contact with said housing when said circuit card is inserted into said housing, at least one of said upper and lower contacts being adapted to be brought into contact with a non-outwardly facing surface of said housing when said circuit card is inserted into said housing; further wherein:

said at least one contact comprises a resilient contact strip which extends rearwardly in the longitudinal direction of said circuit board and parallel to the plane of said circuit board, said resilient contact strip being deflectable in a direction perpendicular to said longitudinal direction and normal to the plane of said circuit board; and said resilient contact strip terminates in a free end which moves toward and away from said circuit board during deflection of said contact strip, and said circuit board has a hole for receiving said free end during such deflection.

* * * * *